(12) United States Patent
Grella et al.

(10) Patent No.: US 7,755,061 B2
(45) Date of Patent: Jul. 13, 2010

(54) DYNAMIC PATTERN GENERATOR WITH CUP-SHAPED STRUCTURE

(75) Inventors: Luca Grella, Gilroy, CA (US); Leonid Baranov, Sunnyvale, CA (US); Yehiel Gotkis, Fremont, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 477 days.

(21) Appl. No.: 11/983,069

(22) Filed: Nov. 7, 2007

(65) Prior Publication Data

US 2009/0114837 A1 May 7, 2009

(51) Int. Cl.
*G21K 1/02* (2006.01)

(52) U.S. Cl. .............................. 250/396 R; 250/505.1; 445/24; 445/50

(58) Field of Classification Search ............. 250/396 R, 250/492.22, 397; 445/24; 313/309, 310
See application file for complete search history.

(56) References Cited

U.S. PATENT DOCUMENTS

| | | | | |
|---|---|---|---|---|
| 5,504,385 | A | * | 4/1996 | Jin et al. ..................... 313/310 |
| 5,588,894 | A | * | 12/1996 | Jin et al. ....................... 445/24 |
| 5,681,196 | A | * | 10/1997 | Jin et al. ....................... 445/24 |
| 5,698,934 | A | * | 12/1997 | Jin et al. ..................... 313/309 |
| 5,821,679 | A | * | 10/1998 | Makishima ................. 313/310 |
| 6,177,218 | B1 | | 1/2001 | Felker et al. |
| 6,207,965 | B1 | | 3/2001 | Koike |
| 6,235,450 | B1 | | 5/2001 | Nakasuji |
| 6,291,119 | B2 | | 9/2001 | Choi et al. |
| 6,333,508 | B1 | | 12/2001 | Katsap et al. |
| 6,414,313 | B1 | | 7/2002 | Gordon et al. |
| 6,429,443 | B1 | | 8/2002 | Mankos et al. |
| 6,511,048 | B1 | | 1/2003 | Sohda et al. |
| 6,525,328 | B1 | | 2/2003 | Miyoshi et al. |
| 6,573,516 | B2 | | 6/2003 | Kawakami |
| 6,586,733 | B1 | | 7/2003 | Veneklasen et al. |
| 6,605,811 | B2 | | 8/2003 | Hotta et al. |
| 6,610,890 | B1 | | 8/2003 | Garcia de Quesada Fort et al. |
| 6,657,211 | B2 | | 12/2003 | Benner |
| 6,674,086 | B2 | | 1/2004 | Kamada |
| 7,061,591 | B2 | | 6/2006 | Bleeker et al. |
| 2003/0210383 | A1 | | 11/2003 | Bjorklund et al. |

FOREIGN PATENT DOCUMENTS

| | | |
|---|---|---|
| EP | 1510848 A1 | 2/2005 |
| JP | 4294319 | 10/1992 |

OTHER PUBLICATIONS

PCT International Search Report for Application No. PCT/US2008/079332, Apr. 9, 2009, 3 sheets.

* cited by examiner

*Primary Examiner*—Nikita Wells
*Assistant Examiner*—Johnnie L Smith
(74) *Attorney, Agent, or Firm*—Okamoto & Benedicto LLP

(57) ABSTRACT

One embodiment relates to a dynamic pattern generator for reflection electron beam lithography which includes conductive pixel pads, an insulative border surrounding each conductive pixel pad so as to electrically isolate the conductive pixel pads from each other, and conductive elements coupled to the conductive pixel pads for controllably applying voltages to the conductive pixel pads. The conductive pixel pads are advantageously cup shaped with a bottom portion, a sidewall portion, and an open cavity. Another embodiment relates to a pattern generating apparatus which includes a well structure with sidewalls and a cavity configured above each conductive pixel pad. The sidewalls may include alternating layers of conductive and insulative materials. Other embodiments, aspects and feature are also disclosed.

16 Claims, 15 Drawing Sheets

DYNAMIC PATTERN GENERATOR WITH CUP-SHAPED STRUCTURE

BACKGROUND

1. Technical Field

The present invention relates generally to semiconductor manufacturing and related technologies. More particularly, the present invention relates to electron beam lithography.

2. Description of the Background Art

As is well-understood in the art, a lithographic process includes the patterned exposure of a resist so that portions of the resist can be selectively removed to expose underlying areas for selective processing such as by etching, material deposition, implantation and the like. Traditional lithographic processes utilize electromagnetic energy in the form of ultraviolet light for selective exposure of the resist. As an alternative to electromagnetic energy (including x-rays), charged particle beams have been used for high resolution lithographic resist exposure. In particular, electron beams have been used since the low mass of electrons allows relatively accurate control of an electron beam at relatively low power and relatively high speed. Electron beam lithographic systems may be categorized as electron-beam direct write (EBDW) lithography systems and electron beam projection lithography systems.

In EBDW lithography, the substrate is sequentially exposed by means of a focused electron beam, wherein the beam either scans in the form of lines over the whole specimen and the desired structure is written on the object by corresponding blanking of the beam, or, as in a vector scan method, the focused electron beam is guided over the regions to be exposed. The beam spot may be shaped by a diaphragm. EBDW is distinguished by high flexibility, since the circuit geometries are stored in the computer and can be optionally varied. Furthermore, very high resolutions can be attained by electron beam writing, since electron foci with small diameters may be attained with electron-optical imaging systems. However, it is disadvantageous that the process is very time-consuming, due to the sequential, point-wise writing. EBDW is therefore at present mainly used for the production of the masks required in projection lithography.

In electron beam projection lithography, analogously to optical lithography, a larger portion of a mask is illuminated simultaneously and is imaged on a reduced scale on a wafer by means of projection optics. Since a whole field is imaged simultaneously in electron beam projection lithography, the attainable throughputs can be markedly higher in comparison with electron beam writers. Disadvantages of conventional electron beam projection lithography systems includes that a corresponding mask is necessary for each structure to be exposed. The preparation of customer-specific circuits in small numbers is not economic, because of the high costs associated with mask production.

SUMMARY

Figure 1:
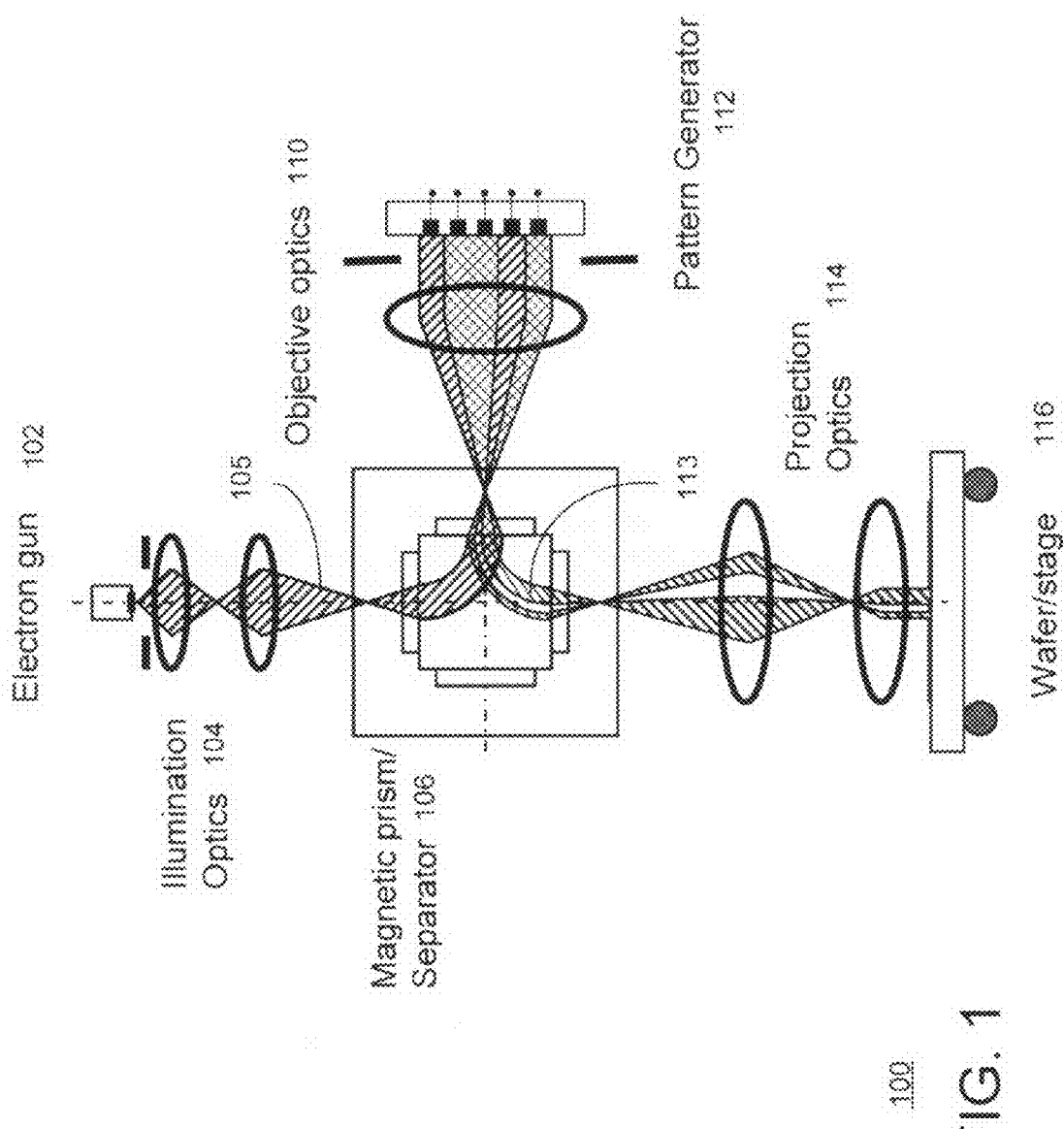
FIG. 1 is a schematic diagram of a maskless reflection electron beam projection lithography system in accordance with an embodiment of the invention.

One embodiment relates to a dynamic pattern generator for reflection electron beam lithography which includes conductive pixel pads, an insulative border surrounding each conductive pixel pad so as to electrically isolate the conductive pixel pads from each other, and conductive elements coupled to the conductive pixel pads for controllably applying voltages to the conductive pixel pads. The conductive pixel pads are advantageously cup shaped with a bottom portion, a sidewall portion, and an open cavity.

Another embodiment relates to a pattern generating apparatus which includes a well structure with sidewalls and a cavity configured above each conductive pixel pad. The sidewalls may include alternating layers of conductive and insulative materials.

Other embodiments, aspects and feature are also disclosed.

DETAILED DESCRIPTION

Maskless Reflection Electron Beam Lithography

As discussed above, electron-beam direct write (EBDW) lithography has the potential to achieve excellent resolution. However, EBDW has a traditional problem relating to its low throughput. For example, it may take ten to one hundred hours to inscribe an entire wafer using EBDW lithography. One previous approach to attempt to increase the throughput is by increasing the beam current. However, when the current density exceeds a certain threshold, electron-electron interactions cause the beam to blur.

This patent application relates to a system and method of electron beam lithography that overcomes the above-discussed disadvantages and problems. Rather than focusing the electron beam into a tiny spot, the approach described herein floods the wafer with the electron beam. This enables use of a high beam current while keeping the beam current density at a level consistent with minimal electron-electron interactions. For example, an area roughly 0.1 millimeters (mm) wide may be illuminated. That area is several orders of magnitude larger than a traditional EBDW system that focuses the beam into a much smaller spot, for example, with a spot size on the order of tens of nanometers (nm) wide.

A flood beam 0.1 mm wide would normally not provide a writing resolution sufficiently high for practical use in integrated circuit manufacturing. However, the system and method disclosed herein enables high-resolution writing by partitioning the flood beam into a multitude (for example, four million) of independently controllable beams.

While others have tried building multiple columns with multiple sources to achieve multiple beams, there are various difficulties in that approach, including the difficulty of making the multiple columns behave uniformly. The system and method disclosed herein may be implemented using a single column and a single source.

A conventional multi-beam system would require a large array of blankers to achieve a multitude of controllable beams from a single column, each blanker being a small and independently controllable element that can be switched on and off rapidly. However, it is quite problematic to build and control such a large array. For example, a blanker array for a conventional multi-beam system is not normally buildable using integrated circuits because such integrated circuits are opaque to electrons.

The system and method disclosed herein re-directs the beam out of the direct line of sight between the electron source and the semiconductor wafer. Independently-controllable voltages are applied to cells of a dynamic pattern generator array that may be implemented using integrated circuit technology. The voltages determine whether each cell reflects electrons onto the wafer or absorbs electrons (preventing them from being reflected onto the wafer).

The system and method disclosed herein advantageously breaks through the traditional EBDW speed-versus-resolution tradeoff by illuminating a large area and simultaneously exposing a multitude of pixels on the wafer. For example, four million pixels may be exposed using a 4000×1000 array of individually addressable elements. This may be achieved using a single column and a conventional electron source.

FIG. 1 is a schematic diagram of a maskless reflection electron beam projection lithography system 100 in accordance with an embodiment of the invention. The name may be abbreviated to a reflection electron beam lithography or REBL system. As depicted, the system 100 includes an electron source 102, illumination electron-optics 104, a magnetic prism 106, an objective electron lens 110, a dynamic pattern generator (DPG) 112, projection electron-optics 114, and a stage 116 for holding a wafer or other target to be lithographically patterned. In accordance with an embodiment of the invention, the various components of the system 100 may be implemented as follows.

The electron source 102 may be implemented so as to supply a large current at low brightness (current per unit area per solid angle) over a large area. The large current is to achieve a high throughput rate. Preferably, the material of the source 102 will be capable of providing a brightness of about $10^4$ or $10^5$ A/cm$^2$ sr (Amperes per cm$^2$ steradian). One implementation uses LaB$_6$, a conventional electron emitter, which typically have a brightness capability of about $10^6$ A/cm$^2$ sr, as the source material. Another implementation uses tungsten dispenser emitters, which typically have a brightness capability of about $10^5$ A/cm$^2$ sr when operating at 50 kilovolts, as the source material. Other possible emitter implementations include a tungsten Schottky cathode, or heated refractory metal disks (i.e. Ta).

The electron source 102 may be further implemented so as to have a low energy spread. The REBL system 100 should preferably control the energy of the electrons so that their turning points (the distance above the DPG 112 at which they reflect) are relatively constant, for example, to within about 100 nanometers. To keep the turning points to within about 100 nanometers, the electron source 102 would preferably have an energy spread no greater than 0.5 electron volts (eV). LaB$_6$ emitters have typical energy spreads of 1 to 2 eV, and tungsten dispenser emitters have typical energy spreads of 0.2-0.5 eV. In accordance with one embodiment of the invention, the source 102 comprises a LaB$_6$ source or tungsten Schottky emitter that is operated a few hundred degrees C below its normal operating temperature to reduce the energy spread of the emitted electrons. However, cooler operating temperatures can destabilize the source 102, for example, due to impurities settling on the source surface and thereby diminishing its reliabilty and stability. Therefore, the source material may be preferably selected to be a material in which impurities are unlikely to migrate to the surface and choke off emission. Moreover, the vacuum on the system may be made stronger to overcome the impurity problem. Conventional lithography systems operate at a vacuum of $10^{-6}$ Torr. A scanning electron microscope (SEM) with a LaB$_6$ source typically operates at $10^{-7}$ Torr. A SEM with a Schottky emitter typically operates at $10^{-9}$ Torr or better in the gun region. In accordance with one implementation, the REBL operates with a gun region vacuum of $10^{-9}$ Torr or lower to protect the stability of the source 102.

The illumination electron-optics 104 is configured to receive and collimate the electron beam from the source 102. The illumination optics 104 allows the setting of the current illuminating the pattern generator structure 112 and therefore determines the electron dose used to expose the substrate. The illumination optics 104 may comprise an arrangement of magnetic and/or electrostatic lenses configured to focus the electrons from the source 102 so as to generate an incident electron beam 105. The specific details of the arrangement of lenses depend on specific parameters of the apparatus and may be determined by one of skill in the pertinent art.

The magnetic prism 106 is configured to receive the incident beam 105 from the illumination optics 104. When the incident beam traverses the magnetic fields of the prism, a force proportional to the magnetic field strengths acts on the electrons in a direction perpendicular to their trajectory (i.e. perpendicular to their velocity vectors). In particular, the trajectory of the incident beam 105 is bent towards the objective lens 110 and the dynamic pattern generator 112. In a preferred embodiment, the magnetic prism 106 is configured with a non-uniform magnetic field so as to provide stigmatic focusing, for example, as disclosed in U.S. patent application Ser. No. 10/775,646, entitled "Improved Prism Array for Electron Beam Inspection and Defect Review," filed Feb. 10, 2004 by inventor Marian Mankos, the disclosure of which is hereby incorporated by reference in its entirety. A uniform magnetic field provides astigmatic focusing wherein focusing occurs in only one direction (for example, so as to image a point as a line). In contrast, the magnetic prism 106 configuration should focus in both directions (so as to image a point as a point) because the prism 106 is also utilized for imaging. The stigmatic focusing of the prism 106 may be implemented by dividing it into smaller sub-regions with different but uniform magnetic fields. Furthermore, the lens elements in the prism 106 may be of a relatively longer length and width so as to provide for a low distortion image over a large field size. However, increasing the length of the prism 106 involves a trade-off of more electron-electron interactions causing more blur. Hence, the reduced image distortion should be balanced against the increased blur when increasing the prism length.

Below the magnetic prism 106, the electron-optical components of the objective optics are common to the illumination and projection subsystems. The objective optics may be configured to include the objective lens 110 and one or more transfer lenses (not shown). The objective optics receives the incident beam from the prism 106 and decelerates and focuses the incident electrons as they approach the DPG 112. The objective optics is preferably configured (in cooperation with the gun 102, illumination optics 104, and prism 106) as an immersion cathode lens and is utilized to deliver an effectively uniform current density (i.e. a relatively homogeneous flood beam) over a large area in a plane above the surface of the DPG 112. In one specific implementation, the objective lens 110 may be implemented to operate with a system operating voltage of 50 kilovolts. Other operating voltages may be used in other implementations.

The dynamic pattern generator 112 comprises an array of pixels. Each pixel may comprise a metal contact to which a voltage level is controllably applied. The principle of operation of the DPG 112 is described further below in relation to FIGS. 3A and 3B.

The extraction part the of the objective lens 110 provides an extraction field in front of the DPG 112. As the reflected electrons 113 leave the DPG 112, the objective optics is configured to accelerate the reflected electrons 113 toward their second pass through the prism 106. The prism 106 is configured to receive the reflected electrons 113 from the transfer lens 108 and to bend the trajectories of the reflected electrons towards the projection optics 114.

The projection electron-optics 114 reside between the prism 106 and the wafer stage 116. The projection optics 114 is configured to focus the electron beam and demagnify the beam onto photoresist on a wafer or onto another target. The demagnification may range, for example, from 1× to 20× demagnification (i.e. 1× to 0.05× magnification). The blur and distortion due to the projection optics 114 is preferably a fraction of the pixel size. In one implementation, the pixel size may be, for example, 22.5 nanometers (nm). In such a case, the projection optics 114 preferably has aberrations and distortions of less than 10-20 nm.

The wafer stage 116 holds the target wafer. In one embodiment, the stage 116 is stationary during the lithographic projection. In another embodiment, the stage 116 is in linear motion during the lithographic projection. In the case where the stage 116 is moving, the pattern on the DPG 112 may be dynamically adjusted to compensate for the motion such that the projected pattern moves in correspondence with the wafer movement. In other embodiments, the REBL system 100 may be applied to other targets besides semiconductor wafers. For example, the system 100 may be applied to reticles. The reticle manufacturing process is similar to the process by which a single integrated circuit layer is manufactured.

Figure 2:
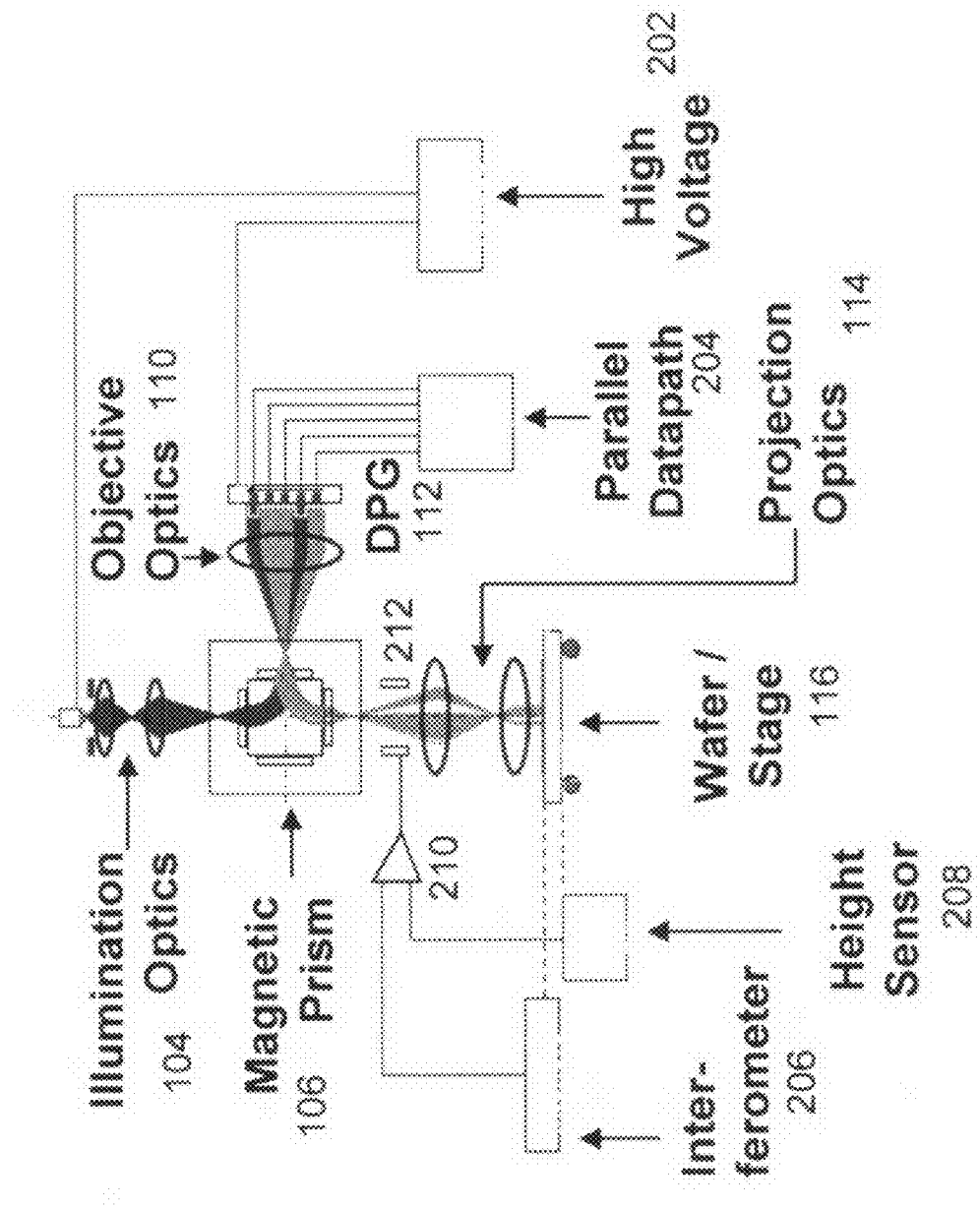
FIG. 2 is a schematic diagram of a maskless reflection electron beam projection lithography system showing further components in accordance with an embodiment of the invention.

FIG. 2 is a schematic diagram of a maskless reflection electron beam projection lithography system 200 showing further components in accordance with an embodiment of the invention. The additional components illustrated include a high voltage source 202, a parallel datapath 204, an interferometer 206, a height sensor 208, feedback circuitry 210, and beam deflectors 212.

The high voltage source 202 is shown as providing a high voltage to the source 102 and to the DPG 112. The voltage provided may be, for example, 50 kilovolts. The parallel data path 204 is configured to carry control signals to the DPG 112 for controlling the voltage on each pixel (so that it either absorbs electrons or reflects them).

In one embodiment, the control signals are adjusted so that the pattern moves electronically across the DPG pixel array in a manner that is substantially the same as the way signals move through a shift register and at a rate so as to match the linear movement of the wafer. In this embodiment, each exposed point on the wafer may receive reflected electrons from an entire column (or row) of DPG pixels, integrated over time. In one implementation of this embodiment, the DPG 112 is configured to resemble a static random access memory (SRAM) circuit, such as that depicted in FIG. 4.

In another embodiment, the control signals are such that the DPG 112 exposes one complete frame at a time. In this embodiment, each pixel on the DPG 112 exposes a corresponding pixel on the wafer. The pattern on the DPG 112 remains constant during the exposure of each frame. In one implementation of this embodiment, the DPG 112 is configured to resemble a dynamic random access memory (DRAM) circuit, such as that depicted in FIG. 5.

The interferometer 206 may be included to provide tight coupling and positional feedback between the electron beam location and the target on the wafer. In one embodiment, the optical beams are reflected off mirrors on the stage. The resulting interference pattern depends on the difference of the individual beam paths and allows accurate measurement of the stage and wafer position. As further described below in relation to FIG. 6, optical beams from the interferometer are diffracted from a grating on the target substrate surface, the resultant interference pattern is sensitive to the phase of the grating and can therefore deliver lateral positional information. Vertical positional information may be provided by a height sensor 208. The positional information may be fed back via feedback circuitry 210 so as to control beam deflectors 212. The deflectors 212 are configured to deflect the projected beam so as to compensate for vibrations and positional drift of the wafer.

Figure 3:
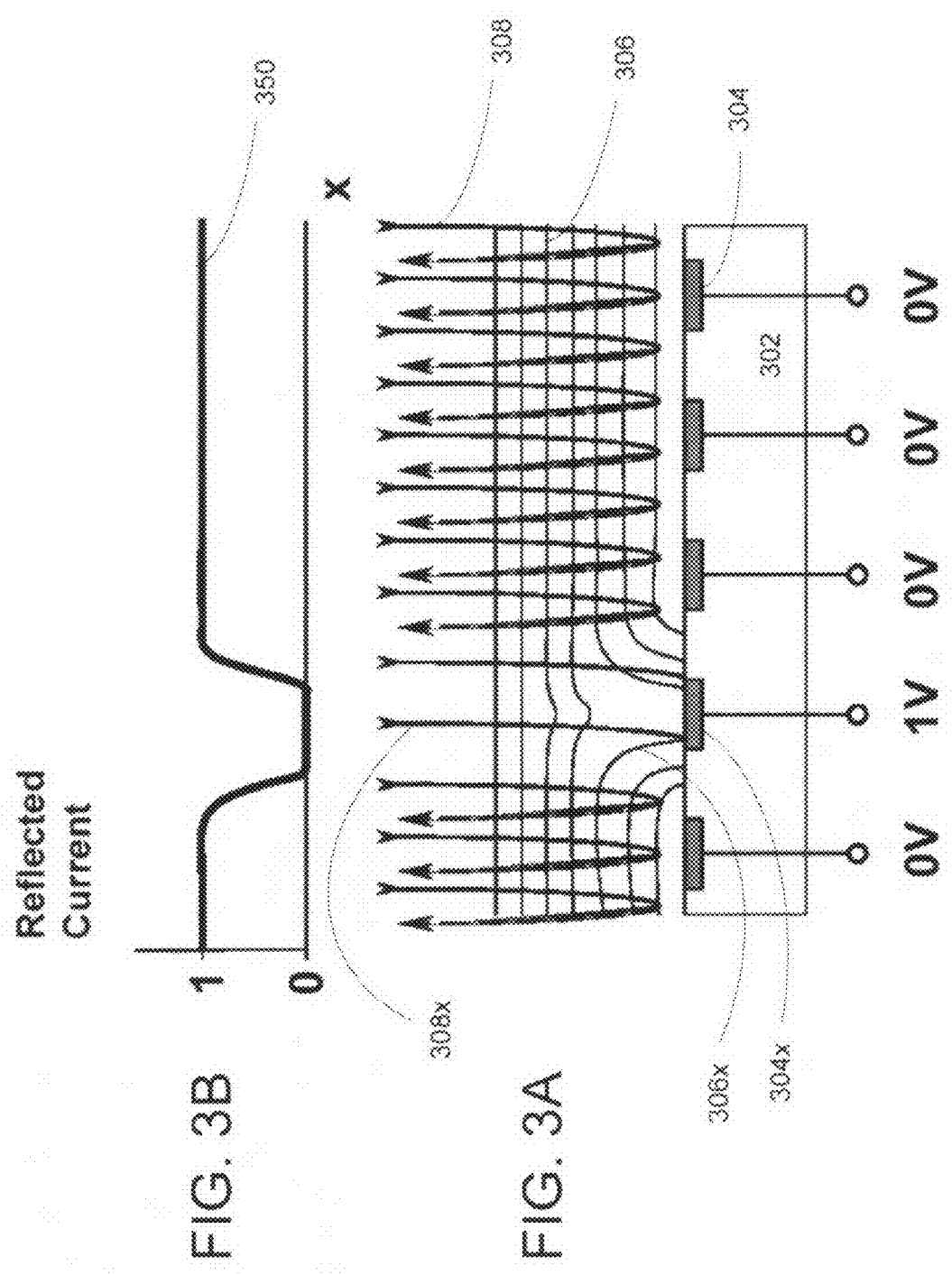
FIGS. 3A and 3B are diagrams illustrating the operation of a dynamic pattern generator in accordance with an embodiment of the invention.

FIGS. 3A and 3B are diagrams illustrating the operation of a dynamic pattern generator in accordance with an embodiment of the invention. FIG. 3A shows a cross-section of a DPG substrate 302 showing a column (or row) of pixels. Each pixel includes a conductive area 304. A controlled voltage level is applied to each pixel. In the example illustrated in FIG. 3A, four of the pixels are "off" and have zero (0) volts applied thereto, while one pixel (with conductive area labeled 304x) is "on" and has one (1) volt applied thereto. (The specific voltages may vary depending on the parameters of the system.) The resultant local electrostatic equipotential lines 306 are shown, with distortions 306x relating to "off" pixel shown. In this example, the incident electrons 308 approaching the DPG 112 come to a halt in front of and are reflected by each of the "on" pixels, but the incident electrons 308x are drawn into and absorbed by the "off" pixel. The resultant reflected current (in arbitrary units) is shown in FIG. 3B. As seen from FIG. 3B, the reflected current is "0" for the "off" pixel and "1" for the "on" pixels.

Figure 4:
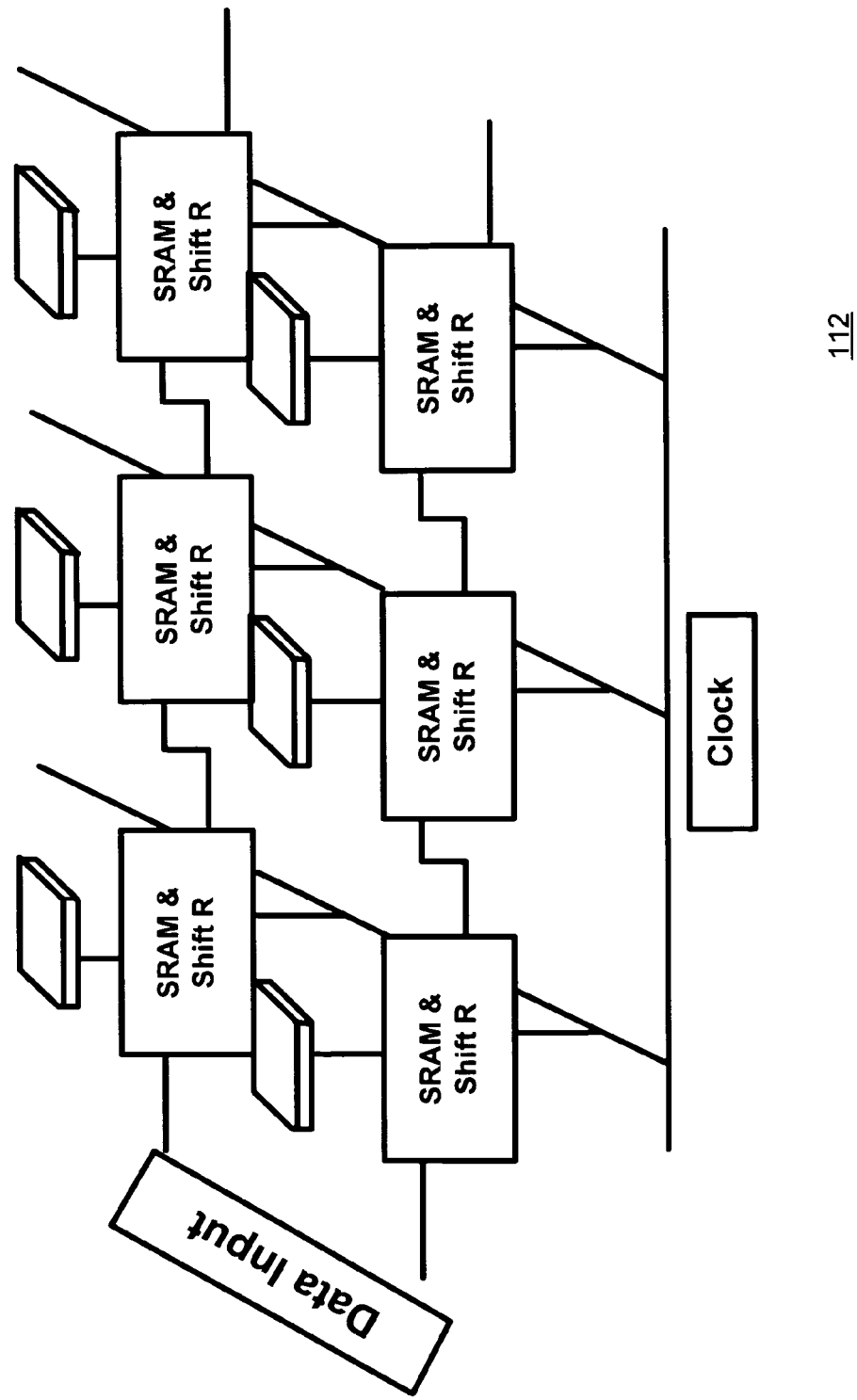
FIG. 4 is a schematic diagram of a dynamic pattern generator implemented in a circuit structure resembling a SRAM in accordance with an embodiment of the invention.

FIG. 4 is a schematic diagram of a dynamic pattern generator 112 implemented in a circuit structure resembling a SRAM in accordance with an embodiment of the invention.

In one embodiment, the SRAM-like DPG 112 is used in a "rolling mode" wherein the lithographic pattern is moved from one row of pixels into the next at the same rate at which the wafer scans. To expose a spot on the photoresist on a wafer, each pixel turns "on" (i.e. become reflective) as the spot passes "beneath" the pixel.

Figure 5:
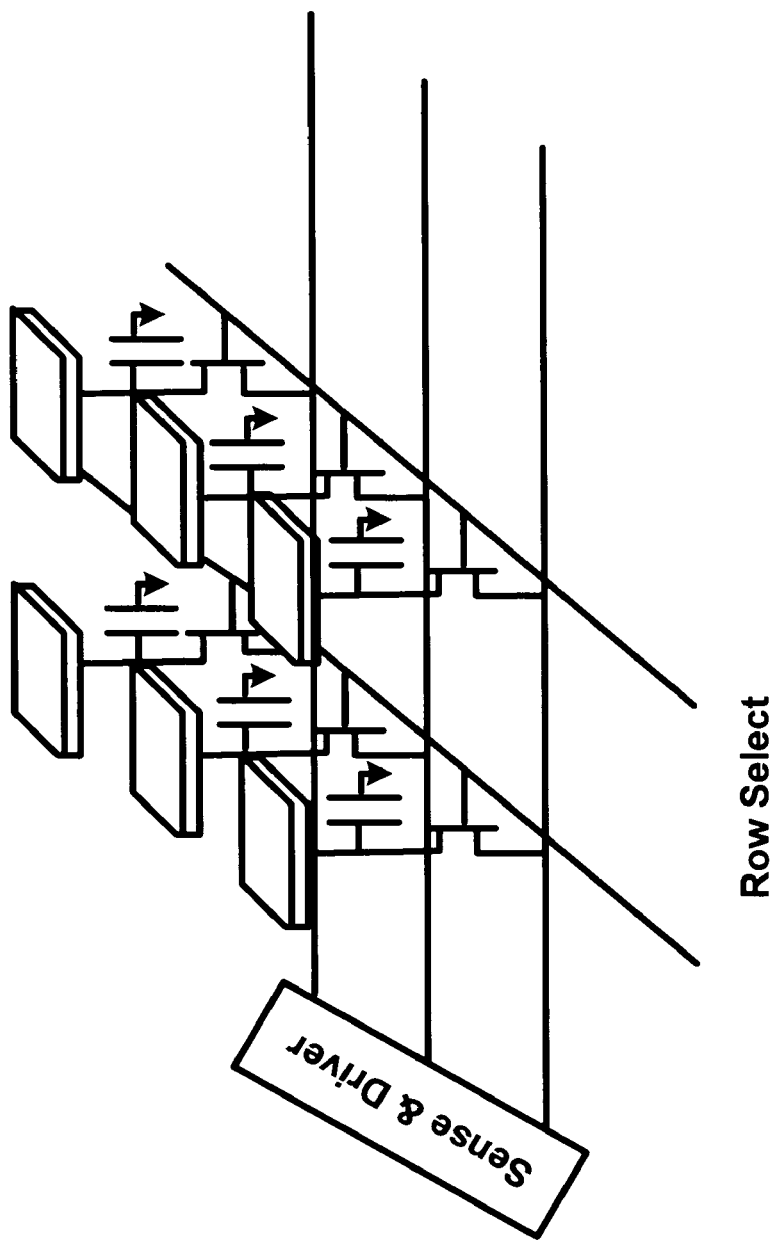
FIG. 5 is a schematic diagram of a dynamic pattern generator implemented in a circuit structure resembling a DRAM in accordance with an embodiment of the invention.

FIG. 5 is a schematic diagram of a dynamic pattern generator 112 implemented in a circuit structure resembling a DRAM in accordance with an embodiment of the invention. Here, each pixel may be implemented with as few as one transistor and one capacitor, so smaller pixels may be implemented. In one embodiment, the DRAM-like DPG 112 is used in "frame" (or "step and flash") mode. In frame mode, the DPG 112 exposes one frame at a time. Each DPG pixel exposes a corresponding pixel on the wafer, and the pattern on the DPG 112 remains constant during the exposure of each frame.

As described above, the DPG 112 comprises a programmable pattern generator structure. In an alternate embodiment, the system 100 may utilize a static patterned structure. As described above, the DPG 112 is utilized to generate a pattern with pixels either on or off. In an alternate embodiment, gray scale values for the pixels may be implemented. Gray scale values may be implemented, for example, by using a finer range of voltage values so as to provide control over the percentage (between 0% and 100%) of electrons reflected by a pixel. Alternatively, gray scale values may be implemented by varying the percentage of time over which each pixel remains on.

Figure 6:
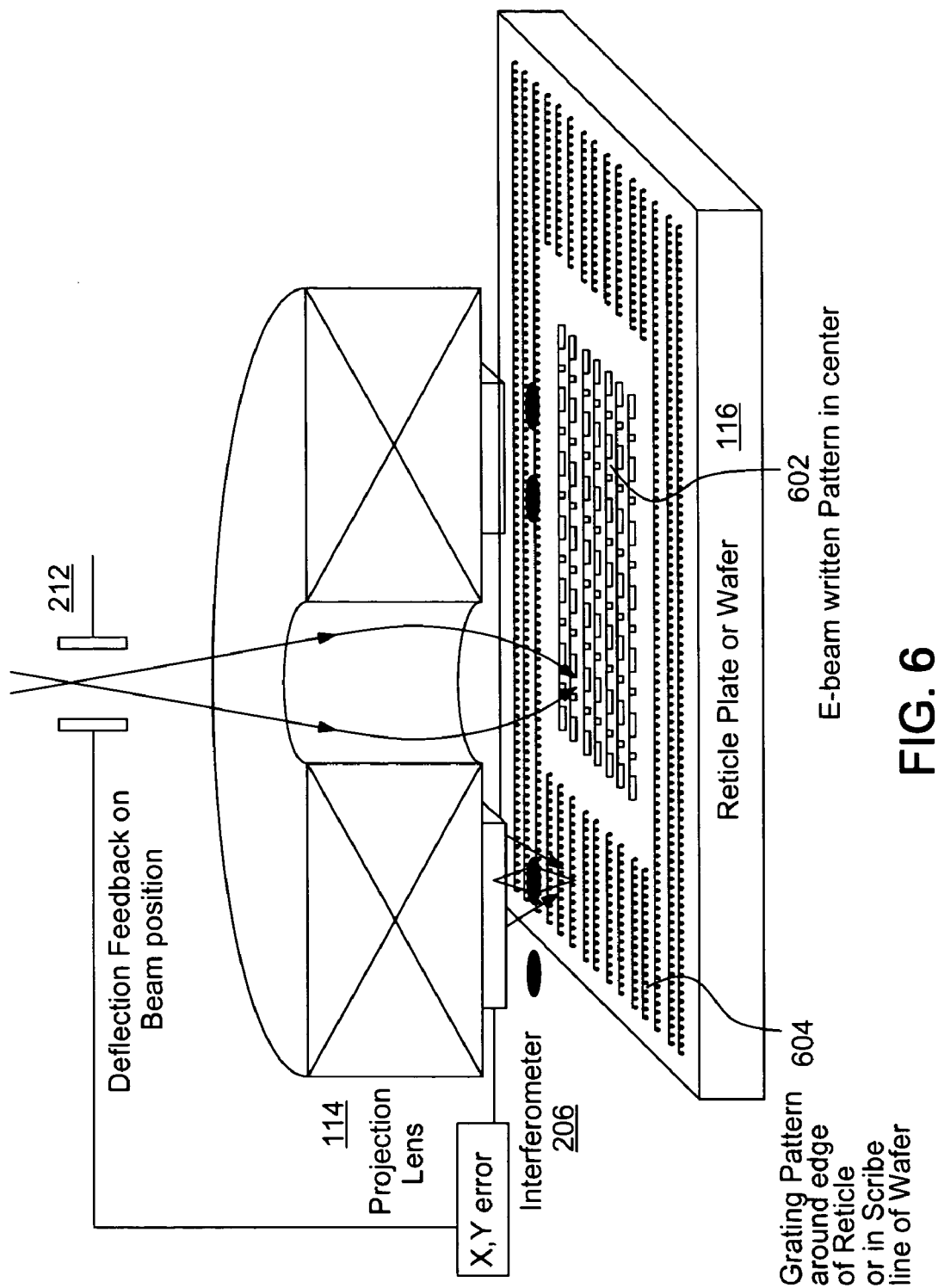
FIG. 6 is a schematic diagram depicting a feedback loop system for controlling beam position in accordance with an embodiment of the invention.

FIG. 6 is a schematic diagram depicting a feedback loop system for controlling electron beam position in accordance with an embodiment of the invention. Here, the electron beam is used to write a pattern 602 in a center portion of a reticle plate or wafer. As shown, the feedback loop system may be implemented using a low-profile waveguided interferometer attached to the projection lens. Dual incident laser beams may be diffracted from a grating pattern 604 into a common first-order axial beam. The resultant interference pattern is sensitive to the phase of the grating and can therefore deliver lateral (both x and y) positional information with sub-nanometer resolution. The grating pattern 604 may be, for example, placed around the edge of a reticle or in the scribe lines on a wafer. The grating pattern 604 may be implemented as a latent image on the photoresist, or as a feature inscribed on the periphery of a bare wafer or reticle blank. The system feeds back positional information to deflectors that steer the electron beam so as to cancel vibrations and positional drift.

In accordance with another embodiment of the invention, a flat or ribbon electron beam is generated by the illumination electron optics. This ribbon type beam may have an aspect ratio of, for example, 1000:1 or 2000:1 so as to be substantially one dimensional. The reflective array may be a one-dimensional array. Advantageously, the one-dimensional reflective array and clocking signals for it may be simpler to implement.

Low-Energy Backscattering Limitation and Solution

Figure 7:
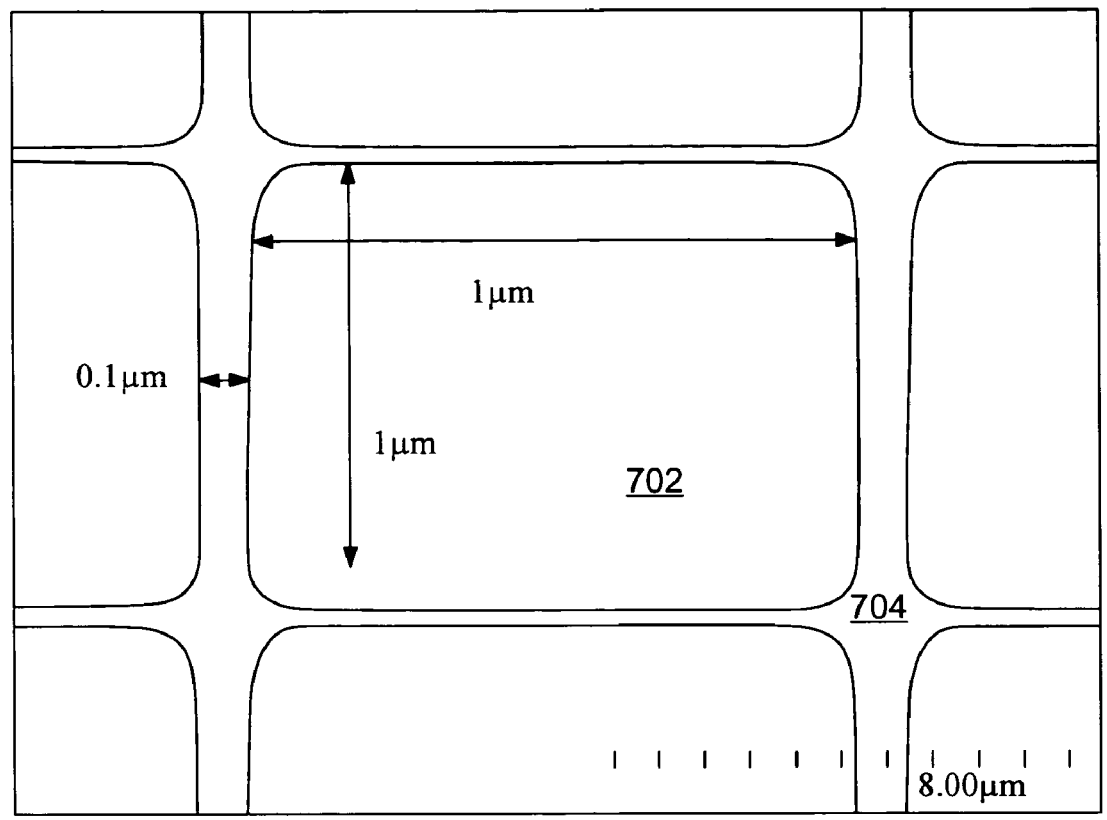
FIG. 7 is an electron micrograph of a surface of a flat dynamic pattern generator structure.
Figure 8:
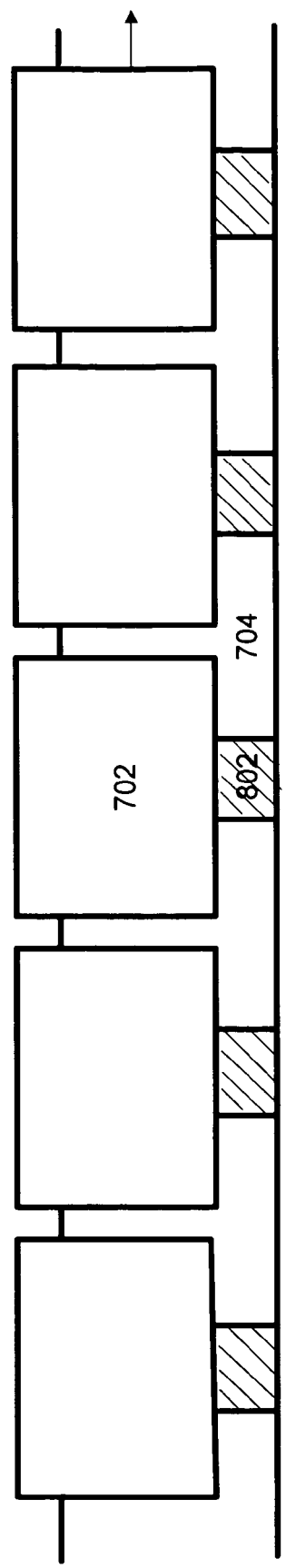
FIG. 8 is a schematic diagram showing a cross-sectional view of a flat dynamic pattern generator structure.

Prior DPG designs had a flat structure, such as that depicted in FIGS. 7 and 8. As discussed below, this flat structure has a limitation due to the backscattering of low energy electrons.

FIG. 7 is an electron micrograph of a surface of a flat dynamic pattern generator structure. The micrograph shows a planar assembly of conductive flat "pixel" pads 702 separated by insulating material borders 704. As shown, in one implementation, the surface area of each pixel may be very roughly 1 micron by 1 micron, and the insulating border may be roughly 0.1 microns wide.

FIG. 8 is a schematic diagram showing a cross-sectional view of a flat dynamic pattern generator structure. As seen, each pixel pad 702 is formed as a solid conductive plug, and the insulative borders 704 are configured to electrically separate the pixels. The insulative borders 704 may be trenches which are partially filled with dielectric material. Voltage may be applied individually via conductive elements 802 to each pixel pad 702.

The voltage applied to each flat pixel pad 702 may be controllably varied so as to either repel the incident electrons or to let them reach the surface and be absorbed. Landing energies for operation may be slightly above the higher end of the electron beam thermal distribution, typically at 3 to 5 electron volts (eV).

However, applicants have determined disadvantageous aspects of flat-structured pixel pads 702. For example, the absorbing performance of a flat pixel pad 702 may be substantially affected by back scattering of low-energy electrons (for example, 3 to 5 eV in energy) from the pixel pad's surface. Such backscattering results in the generation of backscattered (and hence detected) electrons in a regime where no reflected electron flux is expected from the corresponding pixel. This generates noise in the detected data and is an impediment in providing high contrast between the reflective and absorptive pixels of a DPG. For flat structured pixels, the backscattering of low electrons is found to be substantial and sensitive to the choice of the pixel pad material. In addition, strong variations are observed within a set of samples of a same pixel pad material.

To overcome the above-discussed low-energy electron backscattering problem, the present application discloses a dynamic pattern generator with a cup-shaped (well-shaped) structure for the pixel pads. In other words, the DPG comprises pixel pads shaped as Faraday micro-cups.

Applicants have determined that such cup-shaped pixel pads are advantageous in suppressing the undesirable backscattering effects discussed above. Also disclosed is a method of manufacturing the cup-shaped pixel pads on the surface of a DPG.

Figure 9:
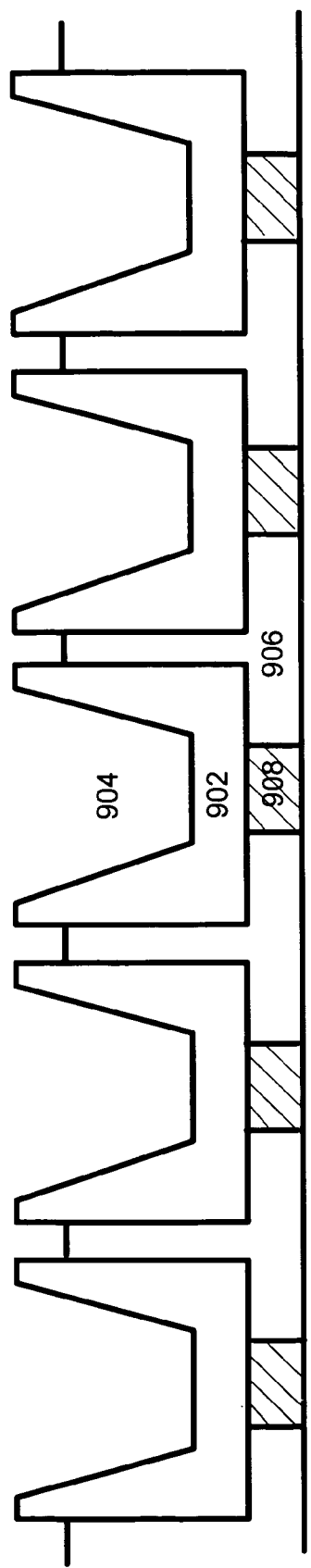
FIG. 9 is a schematic diagram showing a cross-sectional view of a dynamic pattern generator structure having cup-shaped pixel pads in accordance with an embodiment of the invention.

FIG. 9 is a schematic diagram a cross-sectional view of a dynamic pattern generator structure with cup-shaped pixel pads in accordance with an embodiment of the invention. As shown, each pixel pad 902 in this structure is cup-shaped with a bottom portion and side walls so as to form a "cup" with an open volume or cavity 904. Insulative borders 906 are configured to electrically separate the cup-shaped pixel pads 902. Voltages may be applied via conductive elements 908 to the pixel pads 902.

The inner profile geometry for each Faraday cup-shaped pixel pad 902 may vary from conical to cylindrical, depending on performance parameters. The conductive material to form the cup-shaped pixel pads may be a highly conductive material such as, for example, titanium (Ti), titanium nitride, tungsten (W), tantalum (Ta), aluminum (Al), or copper (Cu).

Figure 10A:
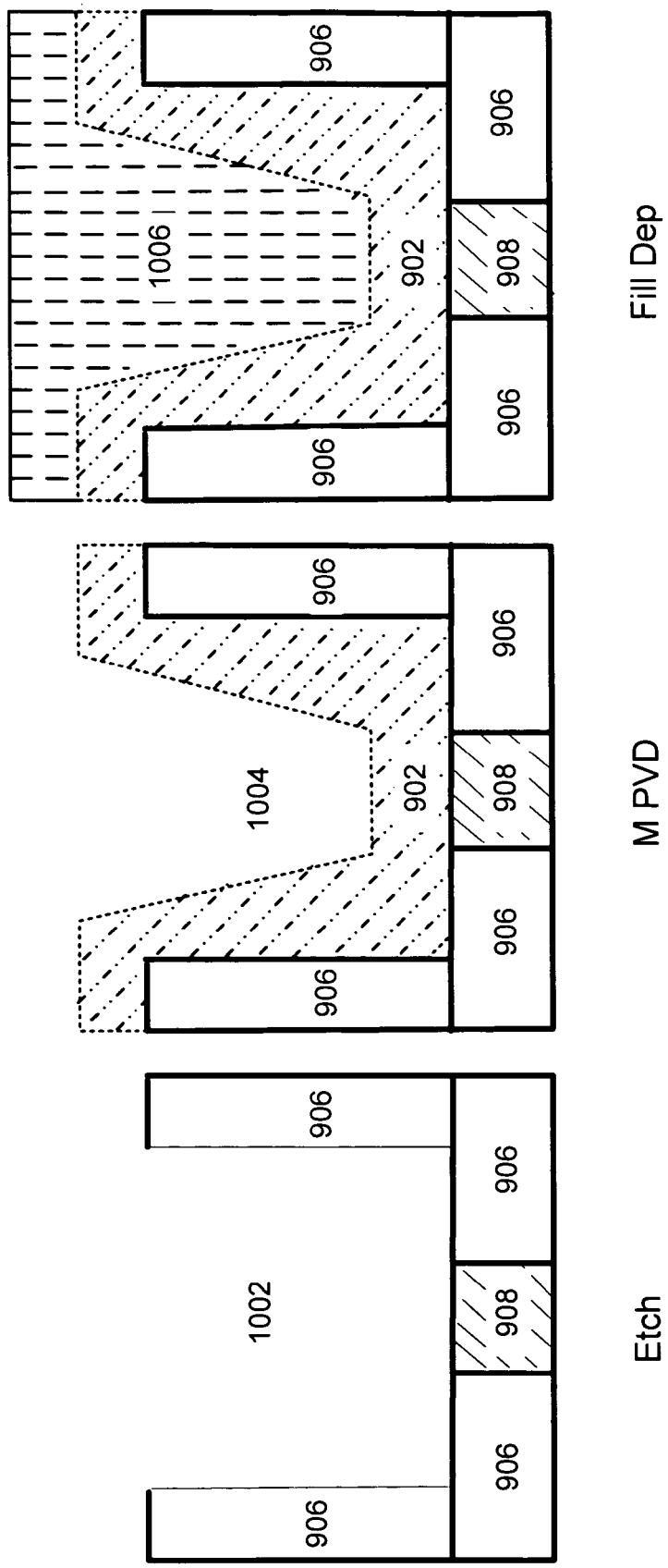
FIGS. 10A and 10B are schematic diagrams illustrating steps in a process for fabricating a cup-shaped pixel pad for a dynamic pattern generator structure in accordance with an embodiment of the invention.
Figure 10B:
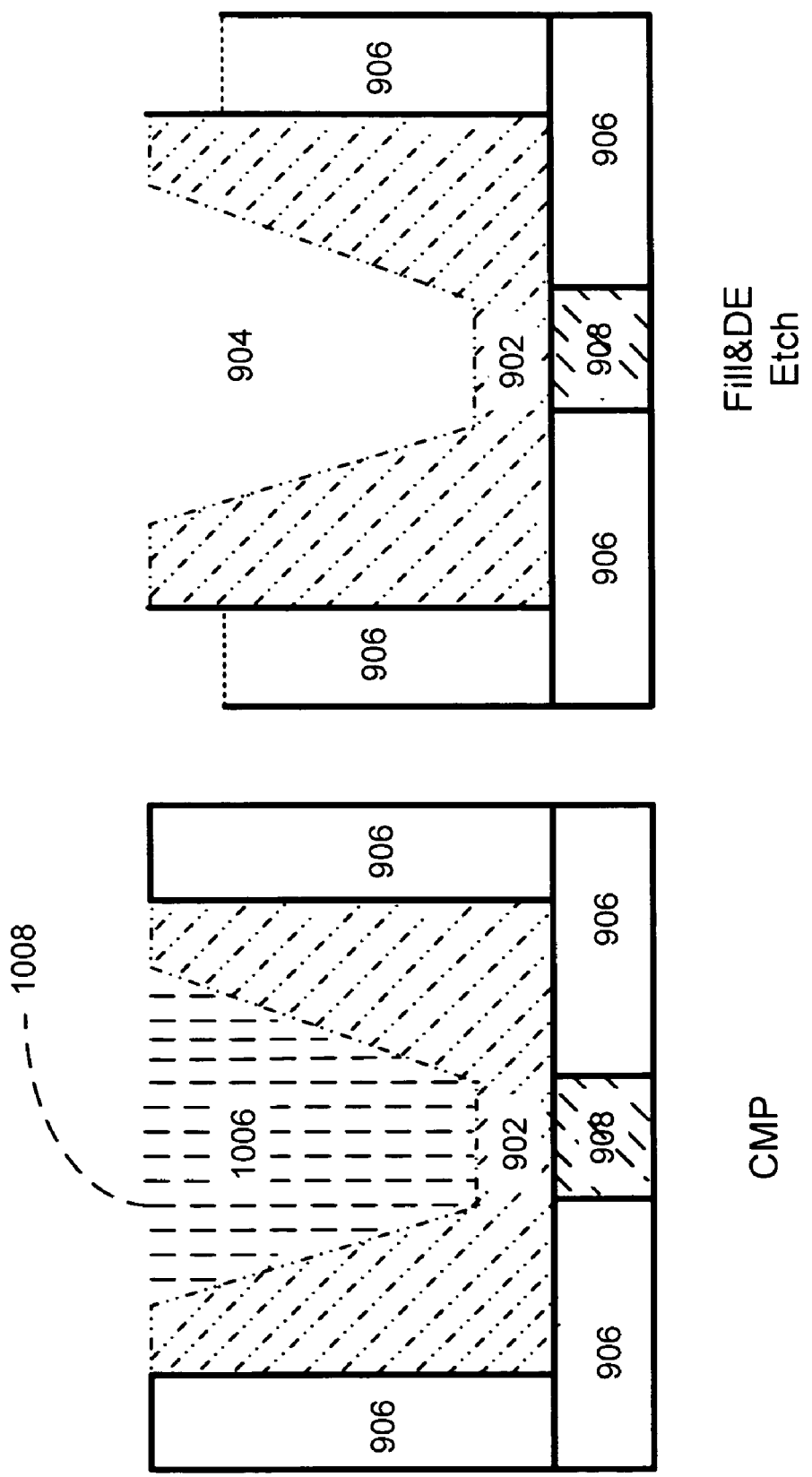

FIGS. 10A and 10B are schematic diagrams illustrating steps in a process for fabricating a cup-shaped pixel pad for a dynamic pattern generator structure in accordance with an embodiment of the invention. While specific process steps are shown in FIGS. 10A and 10B, additional or alternative process steps may be used in other implementations.

First, on the left in FIG. 10A, a diagram shows a cross-sectional view of the structure being manufactured after an etch step which forms a well 1002 for each pixel in the insulative layer but leaves an insulative border 906 around each well to electrically separate the pixel pads. A previously-formed bottom layer with the conductive element 908 used to controllably apply a voltage to the pixel pad is also shown.

Second, in the middle of FIG. 1A, a cross-sectional diagram shows the structure after deposition of the conductive material for the cup-shaped pixel pad 902. For example, a metallic physical vapor deposition process may be used to deposit the conductive material for the pixel pad 902 such that the pixel pad 902 has a "cup-shaped" opening or cavity 1004, rather than being flat.

Third, on the right in FIG. 10A, a cross-sectional diagram shows the structure after a fill deposition which fills 1006 the opening 1004. The material used to fill the opening is such that it may be etched differentially from the conductive material of the pixel pad 902 in a later step.

Fourth, on the left in FIG. 10B, a cross-sectional diagram shows the structure after chemical-mechanical planarization (CMP) of the surface. This results in a flat or planarized surface 1008.

Fifth, on the right in FIG. 10B, a cross-sectional diagram shows the structure after an etch step in which the fill 1006 and the dielectric 906 are selectively etched, while the cup-shaped conductive material of the pixel pad 902 is not etched. This results in the same structure as shown in FIG. 9.

The cup-shaped pixel pad design described above has various advantages. First, it reduces or minimizes the DPG performance sensitivity to pixel pad material choice. Second, it reduces the requirements relating to pixel pad surface contamination and its possible unintended consequence of chemical modification. As a result, the requirements relating to handling of the DPG and vacuum conditions in the DPG chamber may be relaxed. Third, the inner cavity shape of the Faraday cup may be adjusted so as to adjust or optimize the shape of the near-DPG electrical field and so adjust or optimize the DPG performance.

Microlensing Limitation and Solution

Another limitation relates to an effect called microlensing or interlensing which occurs because of the energy spread of the incident electron beam. As discussed above, for example, in relation to FIGS. 3A and 3B, each of the pads may have a voltage applied so that it either absorbs or reflects incident electrons. Applicants have determined that the prior DPG design with flat-shaped pixel pads 702 as shown in FIG. 7 experiences a microlensing or interlensing effect in which electrons to be reflected by the pixel pads at negative potential may behave differently depending upon the potentials at the neighboring pads. The microlensing or interlensing effect affects the linearity of the DPG, making it difficult to implement a gray-level writing implementation.

One potential strategy for mitigating the microlensing effect involves a high immersion electrostatic field applied to the surface of the DPG 112 by the objective electron optics 110 combined with a low energy spread of the incident electron beam 105 (see FIG. 1). By increasing the value of the applied electrostatic field, the electrostatic cross talk between the pixel pads decreases, and by decreasing the energy spread of the incident electron beam, most of the reflected electrons should be reflected near the surface of the pad, potentially minimizing the microlensing.

However, the above potential strategy has some practical limitations. First, an electrostatic field that exceeds a certain value (for example, 200 volts per millimeters) is difficult to achieve without compromising (reducing) the field of view (FOV) of the illuminating (incident) electron beam. A higher electrostatic field will generally introduce more distortions affecting the FOV size and thus the system throughput would be reduced. In addition, increasing the electrostatic field applied by the objective lens also decreases the depth of field (DOF) of the illuminating electron beam. Moreover, a lower energy spread generally requires a lower beam current, also reducing the throughput.

Figure 11:
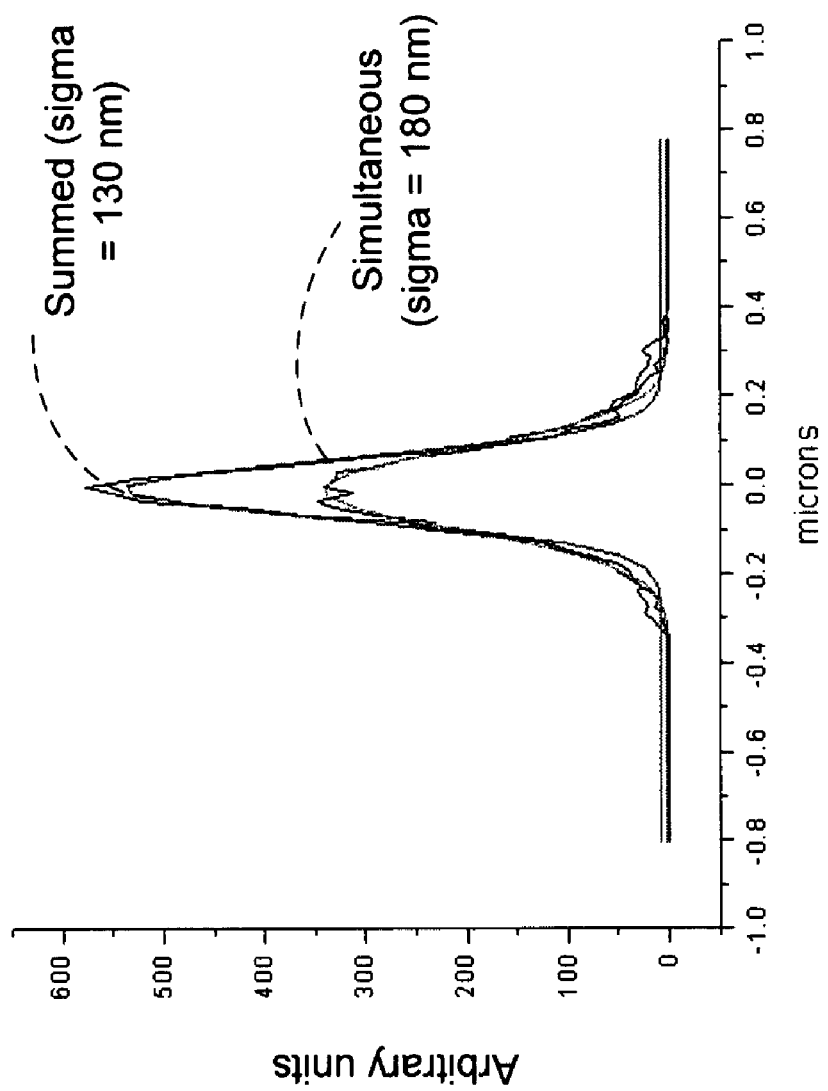
FIG. 11 is a graph showing a comparison between the peak scatter factor (PSF) of four pixels simultaneously on and the PSF of the four pixels summed for a flat pixel pad design.

The microlensing effect and its non-linearity may be shown by comparing a simultaneous "aerial" image formed by four pixels in a 2×2 arrangement simultaneously "on" (i.e. in a reflecting state) with a summation "aerial" image of formed by summing four separate aerial images, each component image being obtained by turning "on" one pixel at a time. For example, FIG. 11 is a graph showing a comparison between the peak scatter factor (PSF) of four pixels simultaneously on and the PSF of the four pixels summed for a flat pixel pad design. As seen in FIG. 11, the "simultaneous" case had a significantly higher sigma of 180 nanometers (nm) compared with the "summed" case which had a lower sigma of 130 nm. This shows evidence of the microlensing effect for the flat pixel pad design.

Figure 12:
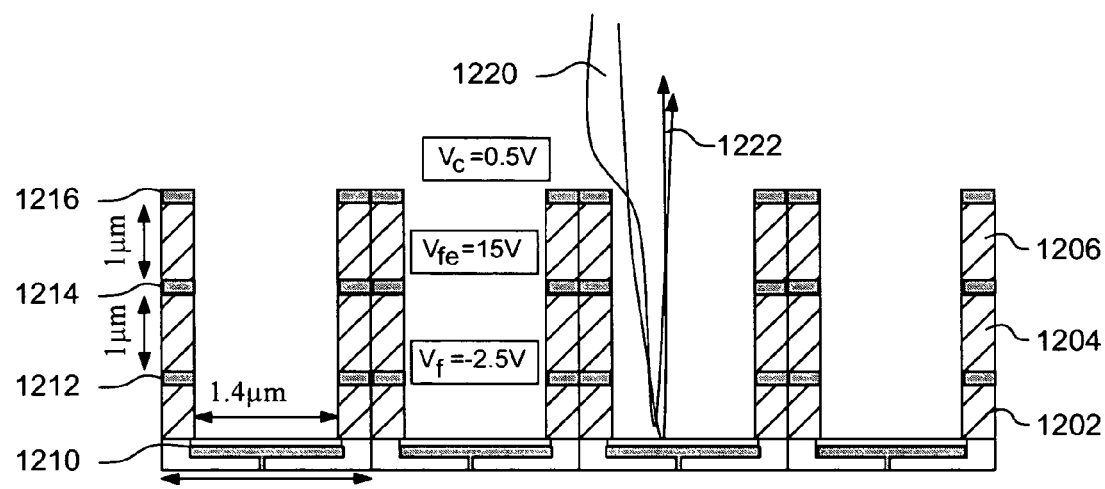
FIG. 12 is a schematic diagram showing a cross-sectional view of a dynamic pattern generator having a cup-shaped (well-shaped) pixel structure which includes stacked electrodes configured to collect, focus, and extract electrons in accordance with an embodiment of the invention.

FIG. 12 is a schematic diagram showing a cross-sectional view of a dynamic pattern generator having a cup-shaped (well-shaped) pixel structure which includes stacked electrodes configured to collect, focus, and extract electrons in accordance with an embodiment of the invention. In this design, the sidewalls of each well (cup) is a stack with alternating insulative (for example, 1202, 1204, and 1206) and conductive (for example, 1212, 1214, and 1216) layers.

In the specific embodiment depicted, the metal pad 1210 at the bottom of each well is about 1.4 microns across. The lower conductive layer 1212 (about 1 micron above and closest to the metal pad at the bottom of the well) has an applied voltage of negative 2.5 volts (V), the middle conductive layer 1214 (about 1 micron above the lower conductive layer) has an applied voltage of positive 15 V, and the upper conductive layer 1216 (about 1 micron above the middle conductive layer) has an applied voltage of positive 0.5 volts.

For example, the reflecting/absorbing metal pad 1210 at the bottom of the well may have a voltage swing of 0 volts (for absorbing) to negative 4 volts (for reflecting). The upper conductive layer (electrode) 1216 may have a relatively weak positive applied voltage of positive 0.5 volts to both screen the insulator from the incoming electron current and to deflect the incoming electrons with lower energy towards the inside of a nearest well. The middle conductive layer (electrode) 1214 may have a relatively strong positive applied voltage of positive 15 volts so as to both focus the incoming electrons by drawing them into the well and extracting the reflected electrons by drawing them out of the well. The lower conductive layer (electrode) 1212 may have a negative applied voltage of negative 2.5 volts so as to focus the reflected electrons. Of course, specific implementations may use different configurations of stacked electrodes and/or different specific voltages to perform the same or similar functionalities.

Figure 13:
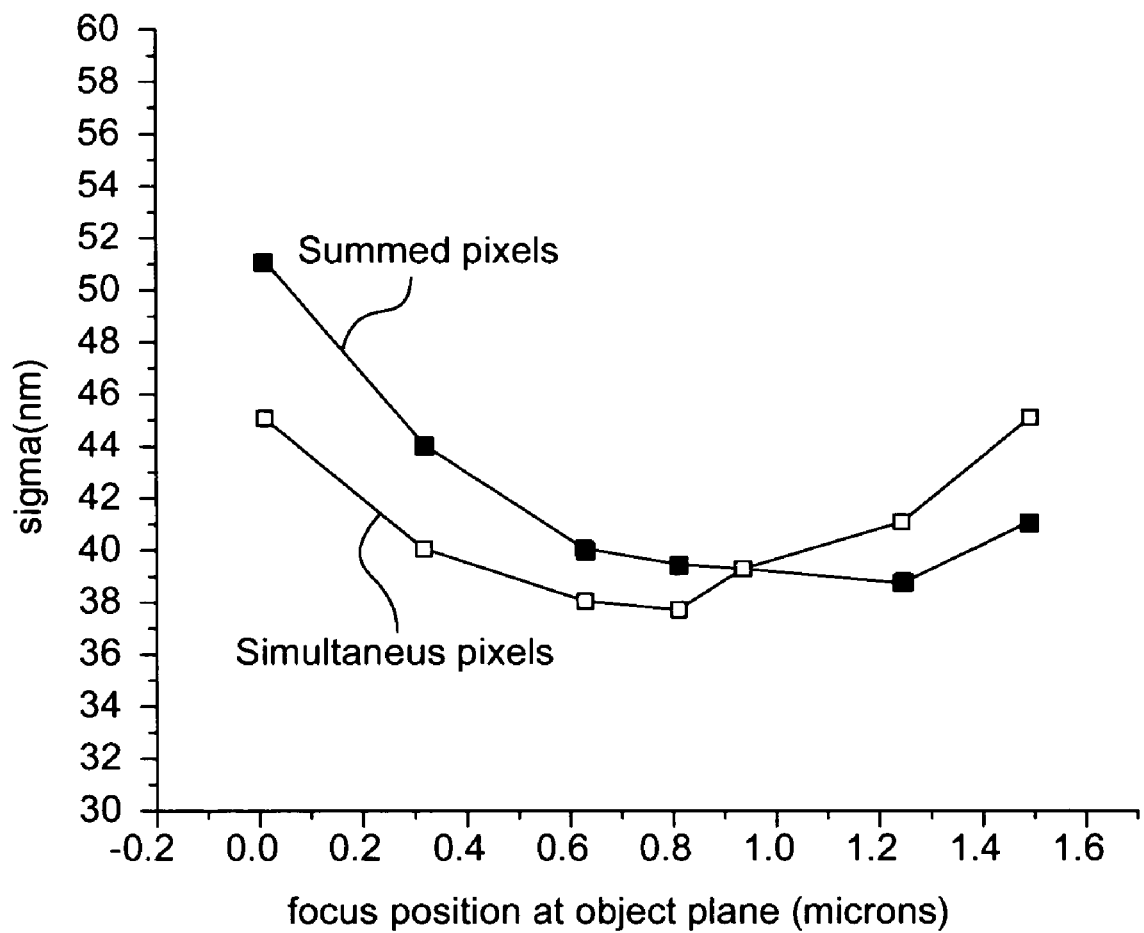
FIG. 13 is a graph showing how the stacked electrode design results in similar sigmas for the simulation with four pixels simultaneously on and the simulation with PSF of the four pixels summed for a well-shaped pixel pad design with stacked electrodes.

FIG. 13 is a graph showing how the stacked electrode design results in similar sigmas for the simulation with four pixels simultaneously on and the simulation with PSF of the four pixels summed for a well-shaped pixel pad design with stacked electrodes. As seen in FIG. 13, the "summed" and "simultaneous" cases had very similar sigmas (ranging from a low point of about 38 or 39 nm) when taking into account a minimal shift in the focus position at the object plane. This means that each well returned a reflected beam whose characteristics are independent or nearly independent from the state of the neighboring wells. Hence, the microlensing or interlensing effect is largely mitigated by the stacked electrode design of FIG. 12.

Figure 14A:
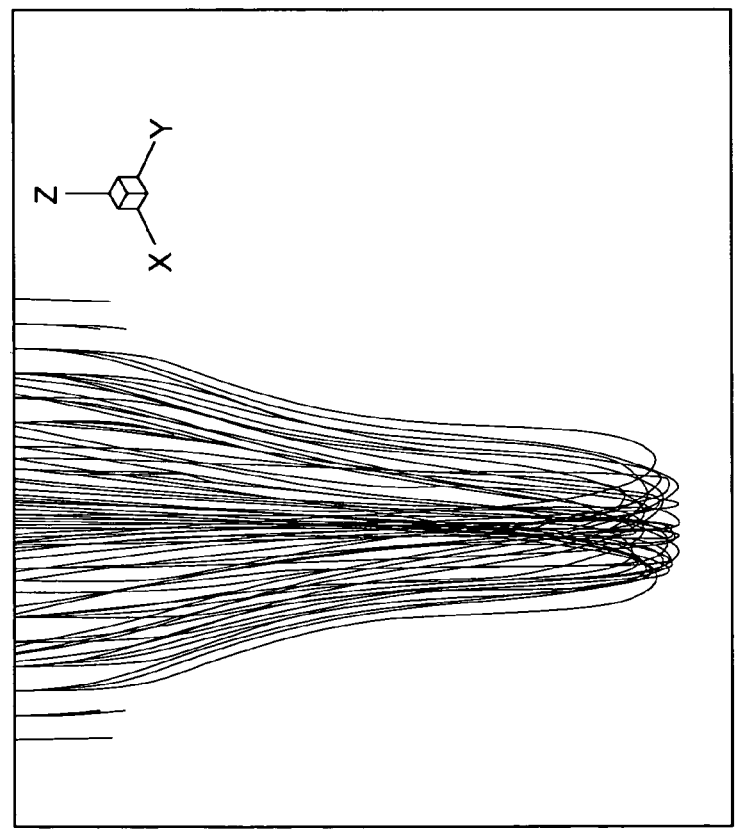
FIGS. 14A and 14B depict electron trajectory simulations showing that a numerical aperture (NA) of the reflected beam may be adjusted by changing the voltage of the lower stacked electrode in accordance with an embodiment of the invention.
Figure 14B:
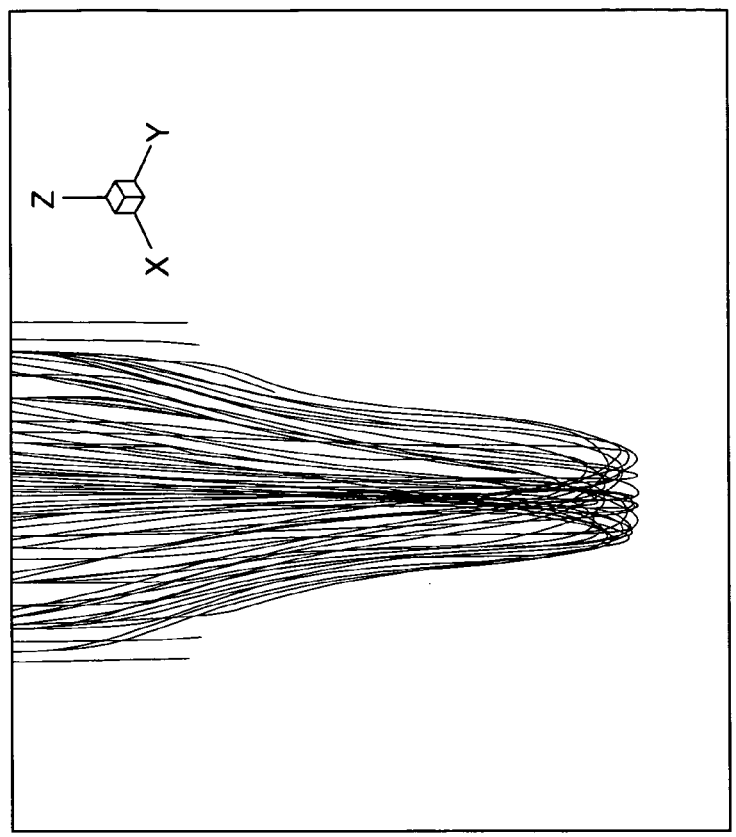

FIGS. 14A and 14B depict electron trajectory simulations showing that a numerical aperture (NA) of the reflected beam may be adjusted by changing the voltage of the lower stacked electrode 1212 in accordance with an embodiment of the invention. The simulation depicted in FIG. 14A adjusted the applied voltage to negative 3.5 volts on the lower electrode 1212. The simulation depicted in FIG. 14B adjusted the applied voltage to negative 1.5 volts on the lower electrode 1212. Advantageously, such adjustments may be utilized to adjust the numerical aperture (NA) or pixel semiangle to potentially compensate for space charge induced aberrations.

Advantageously, the above-described well-shaped pixel structure with stacked electrodes substantially mitigates microlensing effects, such that linear proximity effect correction algorithms may be used. The structure further works well with very low electrostatic fields and so avoid the need for a large immersion field, as well as avoiding the need to reduce the FOV and DOF. It can further work well with relatively large energy spread (for example, an energy spread of 3 eV at full width half maximum), and so enable the use of relatively large illumination currents. In addition, by changing one or more of the applied voltages on the stacked electrodes, space charge induced aberrations may be corrected.

The above-described diagrams are not necessarily to scale and are intended be illustrative and not limiting to a particular implementation. In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. A dynamic pattern generator for reflection electron beam lithography comprising:
   conductive pixel pads;
   an insulative border surrounding each conductive pixel pad so as to electrically isolate the conductive pixel pads from each other; and
   conductive elements coupled to the conductive pixel pads for controllably applying voltages to the conductive pixel pads,
   wherein the conductive pixel pads are cup shaped with a bottom portion, a sidewall portion, and an open cavity.

2. The dynamic pattern generator of claim 1, wherein the cup-shaped pixel pads provide high contrast between reflective and absorptive pixels by reducing backscattering of low energy electrons.

3. The dynamic pattern generator of claim 1, wherein a height of the sidewall portion is greater than a width of the bottom portion.

4. A pattern generating apparatus comprising:
   conductive pixel pads;
   conductive elements coupled to the conductive pixel pads for controllably applying voltages to the conductive pixel pads;
   an insulative border surrounding each conductive pixel pad so as to electrically isolate the conductive pixel pads from each other; and
   a well structure with sidewalls and a cavity configured above each conductive pixel pad.

5. The apparatus of claim 4, wherein the sidewalls comprise alternating layers of conductive and insulative materials.

6. The apparatus of claim 5, wherein the sidewalls comprise at least three layers of insulative material alternating with at least three layers of conductive material.

7. The apparatus of claim 6, wherein voltages are applied to three layers of conductive material in the sidewalls.

8. The apparatus of claim 7, wherein a first voltage applied to an upper conductive layer away from the pixel pad is a small positive voltage, a second voltage applied to a middle conductive layer in a middle region of the sidewalls is a large positive voltage, a third voltage applied to a lower conductive layer close to the pixel pad is a negative voltage.

9. The apparatus of claim 8, wherein a zero voltage is applied to a pixel pad to be in an absorptive state, and a positive voltage between the first and second voltages is applied to a pixel pad to be in a reflective state.

10. The apparatus of claim 6, wherein a voltage applied to at least one of the conductive layers is adjusted to change a numerical aperture of a reflected beam of electrons when a pixel pad is in a reflective state.

11. The apparatus of claim 4, wherein a height of the sidewalls is greater than a width of the conductive pixel pads.

12. A method of reflective electron beam lithography, the method comprising:
   forming an incident electron beam;
   directing the incident electron beam to a dynamically patterned structure having conductive pixel pads with a sidewall surrounding each pixel pad;
   reflecting electrons from a first set of pixel pads of the dynamically patterned structure having a lower voltage level applied thereto;
   absorbing electrons from a second set of pixel pads of the dynamically patterned structure having a higher voltage level applied thereto; and
   directing the reflected electrons towards a target substrate to imprint a lithographic pattern.

13. The method of claim 12, wherein the lithographic pattern of reflected electrons comprises an on/off pattern.

14. The method of claim 12, wherein the lithographic pattern of reflected electrons comprises a gray scale pattern.

15. The method of claim 12, wherein each pixel pad and surrounding sidewall comprises a cup-shaped conductive structure.

16. The method of claim 12, wherein the surrounding sidewall comprises alternating layers of insulative and conductive material, and wherein voltages are applied to the layers of conductive material.

\* \* \* \* \*

UNITED STATES PATENT AND TRADEMARK OFFICE
CERTIFICATE OF CORRECTION

| | | |
|---|---|---|
| PATENT NO. | : 7,755,061 B2 | Page 1 of 1 |
| APPLICATION NO. | : 11/983069 | |
| DATED | : July 13, 2010 | |
| INVENTOR(S) | : Luca Grella et al. | |

It is certified that error appears in the above-identified patent and that said Letters Patent is hereby corrected as shown below:

in column 1, before the "BACKGROUND", insert
 -- STATEMENT REGARDING FEDERALLY SPONSORED RESEARCH OR DEVELOPMENT
 This invention was made with Government support under Agreement No. HR0011-06-3-0008 awarded by DARPA. The Government has certain rights in the invention. --

Signed and Sealed this
Fifth Day of July, 2011

David J. Kappos
*Director of the United States Patent and Trademark Office*